United States Patent
Magari et al.

(10) Patent No.: US 7,729,585 B2
(45) Date of Patent: Jun. 1, 2010

(54) LIGHT SOURCE APPARATUS WITH MODULATION FUNCTION AND ITS DRIVING METHOD

(75) Inventors: Katsuaki Magari, Atsugi (JP); Tsutomu Yanagawa, Isehara (JP); Yoshiki Nishida, Mito (JP); Hiroyasu Mawatari, Isehara (JP); Osamu Tadanaga, Zama (JP); Masaki Asobe, Isehara (JP); Hiroyuki Suzuki, Tokyo (JP); Hiroshi Miyazawa, Tokyo (JP); Junji Yumoto, Tokyo (JP)

(73) Assignees: NipponTelegraph and Telephone Corporation, Chiyoda-ku, Tokyo (JP); NTT Electronics Corporation, Kanagawa-ku, Yokohama-shi, Kanagawa (JP)

( * ) Notice: Subject to any disclaimer, the term of this patent is extended or adjusted under 35 U.S.C. 154(b) by 531 days.

(21) Appl. No.: 11/813,982

(22) PCT Filed: Jan. 17, 2006

(86) PCT No.: PCT/JP2006/000551
§ 371 (c)(1),
(2), (4) Date: Jul. 13, 2007

(87) PCT Pub. No.: WO2006/075760
PCT Pub. Date: Jul. 20, 2006

(65) Prior Publication Data
US 2010/0053720 A1    Mar. 4, 2010

(30) Foreign Application Priority Data
Jan. 17, 2005    (JP)    ............................. 2005-009693

(51) Int. Cl.
G02B 6/00    (2006.01)
H04J 14/02    (2006.01)
(52) U.S. Cl. ............................. 385/122; 385/1; 385/3; 385/37; 385/24; 398/79; 398/87; 398/91; 398/92
(58) Field of Classification Search .................... 385/1, 385/2, 3, 4, 5, 14, 31, 37, 122, 24; 398/79, 398/87, 91, 92; 359/244; 372/21, 22, 26, 372/29, 1
See application file for complete search history.

(56) References Cited

U.S. PATENT DOCUMENTS
6,212,310 B1 *    4/2001    Waarts et al. .................. 385/24
(Continued)

FOREIGN PATENT DOCUMENTS
JP    10-206917    8/1998
(Continued)

*Primary Examiner*—Brian M Healy
(74) *Attorney, Agent, or Firm*—Workman Nydegger

(57) ABSTRACT

A light source apparatus with modulation function has a wavelength conversion module (75) composed of a nonlinear optical material with a structure having a nonlinear constant modulated periodically. It outputs a difference frequency or sum frequency produced by multiplexing pumping light from semiconductor laser light sources (71) and (72) with different wavelengths through a WDM coupler (74) and by launching the multiplexed light into the optical waveguide. The semiconductor laser light source (72) includes a diffraction grating. The semiconductor laser light source (71) includes a section for modulating output light emitted from its semiconductor laser, and is connected to an external FBG (73) which has a reflection band narrower than a resonance wavelength spacing determined by the device length of the semiconductor laser. The FBG (73) is supplied with the modulated output.

18 Claims, 18 Drawing Sheets

U.S. PATENT DOCUMENTS

| | | | |
|---|---|---|---|
| 6,275,632 B1 * | 8/2001 | Waarts et al. | 385/37 |
| 6,298,187 B1 * | 10/2001 | Waarts et al. | 385/37 |
| 6,411,323 B1 * | 6/2002 | Waarts et al. | 347/241 |
| 6,907,051 B1 * | 6/2005 | Farmer | 372/3 |
| 2009/0245294 A1 * | 10/2009 | Alkulov et al. | 372/6 |

FOREIGN PATENT DOCUMENTS

| | | |
|---|---|---|
| JP | 2003-140214 | 5/2003 |
| JP | 2003-188455 | 7/2003 |
| JP | 2003-307759 | 10/2003 |
| JP | 2004-70338 | 3/2004 |
| WO | WO 2004/025363 A1 | 3/2004 |

* cited by examiner

LIGHT SOURCE APPARATUS WITH MODULATION FUNCTION AND ITS DRIVING METHOD

TECHNICAL FIELD

The present invention relates to a visible, middle infrared or infrared light source using second-harmonic generation, difference-frequency generation or sum-frequency generation effect produced in a nonlinear optical medium, and more particularly to a light source apparatus with modulation function capable of varying the intensity of light generated.

BACKGROUND ART

Although laser technology has made remarkable progress at present, laser oscillation is not implemented over the entire wavelength domain. Accordingly, wavelength conversion technology utilizing nonlinear optical effect is an important technology to obtain coherent light in a wavelength range in which the laser oscillation is not easy.

Among nonlinear optical effect, the application of wavelength conversion devices is expected which generate a second harmonic, sum frequency or difference frequency by pseudo-phase matching by making use of the second order nonlinear optical effect (see Patent Document 1).

FIG. 1 shows a configuration of a conventional pseudo-phase matching type wavelength conversion device. A multiplexer 11 multiplexes pumping light A (wavelength $\lambda_1$) from a semiconductor laser light source and pumping light B (wavelength $\lambda_2$) from another semiconductor laser light source, and launches into a nonlinear waveguide 12 having a polarization inversion structure. The waveguide 12 converts the pumping light A to difference frequency light C with a wavelength $\lambda_3$ and emits it together with the pumping light B. A demultiplexer 13 separates the difference frequency light C from the pumping light B.

For example, assume that the pumping light A has a wavelength $\lambda_1=1.06$ μm, and that the pumping light B with a wavelength $\lambda_2=1.55$ μm is input. In this case, the wavelength converted light C with a wavelength $\lambda_3=3.35$ μm can be obtained by the difference-frequency generation.

Making use of such a wavelength conversion device as a middle infrared laser light source can implement highly sensitive gas sensors and the like utilizing the middle infrared light.

According to another embodiment in FIG. 1, the multiplexer 11 multiplexes the comparatively high intensity pumping light A with the pumping light B, and launches into the nonlinear waveguide 12 having the polarization inversion structure. The waveguide 12 generates the wavelength converted light C of the pumping light A and the pumping light B, and emits it. For example, assume that the pumping light A has a wavelength $\lambda_1=1.06$ μm and the pumping light B has a wavelength $\lambda_2=1.32$ μm. Then, the wavelength converted light C with a wavelength $\lambda_3=0.59$ μm, which is yellow visible light, is obtained by the sum-frequency generation.

A yellow visible light source using the wavelength conversion device based on the sum-frequency generation is applicable as a light source for measuring refractive indices instead of a conventional D line light source of an Na lamp. In addition, the yellow visible light source using the wavelength conversion device based on the sum-frequency generation has marked effect on increasing the sensitivity of optical equipment using visible light such as fluorescence microscopes.

Such a yellow visible light source includes in its casing a 1.06 μm semiconductor laser that stabilizes its wavelength using an external resonator utilizing a fiber Bragg grating (FBG) as the pumping light, a DFB (Distributed Feedback) laser whose oscillation wavelength is 1.32 μm, a multiplexing means such as a WDM coupler, and a modularized wavelength conversion device. Here, as the light source used as the pumping light, a light source with single mode oscillation such as a DBR (Distributed Bragg Reflector) laser and DFB laser is preferable. When it does not have the single mode oscillation, it is preferable that a light source be used whose wavelength is stabilized by adding an external resonator using an FBG.

The FBG, which has a Bragg diffraction grating formed in a core section of an optical fiber, is an optical fiber type device with a characteristic of reflecting only light with a particular wavelength. The FBG has as its property a low loss, good coupling characteristic with an optical fiber, and superior reflection characteristics. Thus, besides the reflection light filter, the FBG is widely applied to wavelength control devices, optical sensor devices and dispersion compensation devices.

The DFB laser is a semiconductor laser that oscillates laser light by confining light to an active region by operating a periodic shape built in a laser chip as a diffraction grating, and by reflecting only light with a particular wavelength. It is superior to a Fabry-Perot semiconductor laser without having a diffraction grating in the monochromaticity of the wavelength of the laser light, and is suitable for light signal transmission beyond several kilometers.

FIG. 2 illustrates pseudo-phase matching conditions for obtaining green light with a wavelength of 0.53 μm by the second-harmonic generation. FIG. 2 is a diagram of the pseudo-phase matching curve calculated under the assumption that lithium niobate is used as a nonlinear optical material, the polarization inversion period is 6.76 μm and a wavelength conversion device with a length of 10 mm is used. The horizontal axis shows the wavelength of the pumping light, and the vertical axis shows the normalized light intensity of the second harmonic obtained. FIG. 2 shows that the pseudo-phase matching band is equal to or less than 0.2 nm. Accordingly, the oscillation wavelength of a 1.06 μm semiconductor laser must be stabilized within the spectral width of 0.2 nm. To obtain the light output of stable wavelength converted light, the wavelength stabilization is an essential condition because the pseudo-phase matching bandwidth of the wavelength conversion device used for obtaining the visible light is narrow.

The wavelength converted light C generated under such conditions inherits a coherent characteristic from the semiconductor laser serving as the pumping light, and is effective as the visible light source for increasing sensitivity of refractive index measurement and of fluorescent protein observation with a fluorescence microscope. To increase the measurement sensitivity, however, a high extinction factor is required, and an ON/OFF modulation function must be provided.

Until now, however, the ON/OFF modulation is carried out using a single semiconductor laser as the visible light source, or by connecting an external AO modulator to a solid laser. Thus, the ON/OFF modulation function has not yet been implemented in the light source that generates the difference frequency or sum frequency by using the optical waveguide composed of a nonlinear optical material and two semiconductor laser light sources.

FIG. 3 illustrates current-light output characteristics of a 1.06 μm-band semiconductor laser connected to an external FBG. The semiconductor laser connected to the FBG usually has a reflection band of about 2 nm due to the FBG, and is placed in a multimode state in which a plurality of wavelengths oscillate within that range. Although a result obtained by differentiating the light output by current is referred to as differential efficiency, the differential efficiency characteristics represented by broken lines have a plurality of discontinuous locations, and hence the current-light output characteristics have minute discontinuities. In the case where such discontinuities are present, it is very difficult to carry out the light output stabilization control (APC) for the semiconductor laser. Thus, generally, the external resonator type semiconductor laser having the external FBG has not been used in a modulated state.

FIG. 11A illustrates current-light output characteristics of a 1.32 μm-band DFB laser. Controlling the current of the 1.32 μm-band DFB laser enables the output of the wavelength converted light to be turn on and off in accordance with the current-light output characteristics of FIG. 11A, and enables the light source apparatus with modulation function to have a conversion function.

The 1.32 μm-band DFB laser employed here has $I_{th}$=10 mA or so, and operates stably at the signal wavelength even when the operation current is placed at about 30 times the $I_{th}$ to increase the light output. FIG. 11A shows the differential efficiency by broken lines. Except for the threshold value, no discontinuous locations appear in the differential efficiency characteristics, and no module jumps of the oscillation wavelength occur. However, increasing the operation current of the 1.32 μm-band DFB laser up to 300 mA brings about a temperature rise in the device, which shifts the oscillation wavelength about 0.8 nm with keeping the single wavelength. The range of variation of 0.8 nm of the oscillation wavelength is four times wider than the foregoing pseudo-phase matching band. In addition, the portion outside the pseudo-phase matching band does not contribute to the wavelength converted light. Accordingly, it is impossible to increase the operation current beyond about ¼ of 300 mA, or about 80 mA, substantially, and hence the light output obtained reduces to about ¼. This means that the output intensity of the wavelength converted light also reduces to about ¼. Thus, the practical output intensity of the wavelength converted light cannot be achieved by only carrying out the modulation in the 1.32 μm-band DFB laser.

Patent Document 1: Japanese Patent Laid-open No. 2003-140214.

DISCLOSURE OF THE INVENTION

The present invention is implemented to solve the foregoing problems. Therefore it is an object of the present invention to provide a light modulation method and a light source apparatus with modulation function capable of carrying out modulation with maintaining practical light intensity to the light source apparatus which has a pseudo-phase matching type wavelength conversion device and emits a difference frequency or sum frequency.

According to an aspect of the present invention, there is provided a light source apparatus with modulation function having an optical waveguide composed of a nonlinear optical material with a structure having a nonlinear constant modulated periodically, the light source apparatus multiplexing pumping light from first and second semiconductor laser light sources having different wavelengths and launching multiplexed pumping light into the optical waveguide, thereby outputting a difference frequency or a sum frequency produced from the optical waveguide, or outputting a second harmonic from the second semiconductor laser light source, wherein the second semiconductor laser light source comprises: a semiconductor laser; an FBG; and means for modulating the semiconductor laser, and wherein a reflection band of the FBG is narrower than a resonance wavelength spacing determined by a device length of the semiconductor laser.

According to another aspect of the light source apparatus with modulation function, a lower limit of current amplitude modulation for the second semiconductor laser light source can be set in a manner that the lower limit is equal to or less than a threshold value and that an emitted wavelength becomes a shorter wavelength side wavelength in a pseudo-phase matching band of the nonlinear optical material; and an upper limit of the current amplitude modulation can be set at a current value lower than a current value causing an initial kink in current-light output characteristics.

According to another aspect of the light source apparatus with modulation function, an isolator can be connected to an output of the FBG.

According to another aspect of the light source apparatus with modulation function, a temperature control means can be added to the FBG.

According to one aspect of a light source apparatus with modulation function having an optical waveguide composed of a nonlinear optical material with a structure having a nonlinear constant modulated periodically, and multiplexing pumping light from first and second semiconductor laser light sources having different wavelengths and launching multiplexed pumping light into the optical waveguide, thereby outputting a difference frequency or a sum frequency produced from the optical waveguide, or outputting a second harmonic from the first semiconductor laser light source, the first semiconductor laser light source can comprise: a diffraction grating; and means for modulating output light emitted from a semiconductor laser, and a lower limit of current amplitude modulation for the first semiconductor laser light source can be set in a manner that the lower limit is equal to or less than a threshold value and that an emitted wavelength immediately after the threshold value becomes a shorter wavelength side wavelength in a pseudo-phase matching band of the nonlinear optical material; and an upper limit of the current amplitude modulation can be a current value that achieves a shorter wavelength side wavelength than a peak wavelength of a pseudo-phase matching band of the nonlinear optical material, and a longer wavelength side wavelength than an emitted wavelength immediately after the threshold value.

According to another aspect of the light source apparatus with modulation function, the first and second semiconductor laser light source can include means for modulating output light emitted from semiconductor lasers, and can be synchronized to each other.

According to another aspect of the light source apparatus with modulation function, the nonlinear optical crystal can consist of one of $LiNbO_3$, $LiTaO_3$, and $LiNb(x) Ta(1-x)O_3$ ($0 \leq x \leq 1$), or a combination of them, or can include as a dopant to them at least one material selected from a group consisting of Mg and Zn.

According to another aspect, the light source apparatus with modulation function can be incorporated into a fluorescence microscope system.

According to an aspect of the present invention, there is provided a light modulation method employing a light source apparatus including a first semiconductor laser, a second semiconductor laser, and an optical waveguide composed of a nonlinear optical material with a structure having a nonlinear constant modulated periodically, the light modulation method comprising: a step of emitting modulated light from the second semiconductor laser; a step of launching the modulated light at the step of emitting into an FBG with a reflection band narrower than a resonance wavelength spacing determined by a device length of the second semiconductor laser; a step of launching into the optical waveguide, light resultant from multiplexing light emitted from the first semiconductor laser and light emitted from the FBG; and a step of emitting from the optical waveguide a difference frequency or a sum frequency of light from the first and second semiconductor lasers.

According to another aspect of the light modulation method, it can further comprise a step of launching the light emitted from the FBG into an isolator, wherein the step of launching into the optical waveguide can comprise a step of multiplexing the light emitted from the first semiconductor laser and light emitted from the isolator.

According to another aspect of the light modulation method, it can further comprise a step of regulating temperature of the FBG within a prescribed range.

According to another aspect of the light modulation method, it can further comprise: a step of setting a lower limit of current amplitude modulation for the second semiconductor laser light source in a manner that the lower limit is equal to or less than a threshold value and that an emitted wavelength becomes a shorter wavelength side wavelength in a pseudo-phase matching band of the nonlinear optical material; and a step of setting an upper limit of the current amplitude modulation at a current value lower than a current value causing an initial kink in current-light output characteristics.

According to one aspect of a light source apparatus for outputting a sum frequency, which includes a first semiconductor laser with a built-in diffraction grating, a second semiconductor laser, and an optical waveguide composed of a nonlinear optical material with a structure having a nonlinear constant modulated periodically, it is possible to comprise: a step of emitting modulated light from the first semiconductor laser; a step of launching into the optical waveguide, light resultant from multiplexing light emitted from the first semiconductor laser and light emitted from the second semiconductor laser; a step of emitting from the optical waveguide a difference frequency or a sum frequency of light from the first and second semiconductor lasers; a step of setting a lower limit of current amplitude modulation for the first semiconductor laser light source in a manner that the lower limit is equal to or less than a threshold value and that an emitted wavelength becomes a shorter wavelength side wavelength in a pseudo-phase matching band of the nonlinear optical material; and a step of setting an upper limit of the current amplitude modulation in a manner that the emitted wavelength becomes a shorter wavelength side wavelength than a peak wavelength of the pseudo-phase matching band of the nonlinear optical material, and becomes a longer wavelength side wavelength than an emitted wavelength immediately after the threshold value.

According to another aspect of the light modulation method, it can further comprising a step of modulating the light of the first semiconductor laser in synchronization with modulation of the light of the second semiconductor laser.

According to the present invention, the light source apparatus with modulation function having practical light intensity can be fabricated. It can increase the sensitivity not only of the refractive index measurement using visible light, but also of the fluorescent protein observation with a fluorescence microscope.

BEST MODE FOR CARRYING OUT THE INVENTION

The present inventors have made an intensive study of a method of adding a modulation function to a wavelength conversion-type light source apparatus with practical light intensity. As a result, we have found that a practical light source apparatus with modulation function can be implemented by modulating the driving current of a pumping source consisting of a 1.32 μm-band DFB laser or a 1.06 μm semiconductor laser stabilized at a single wavelength with a narrow band FBG. In addition, we have found that the practical light source apparatus with modulation function can also be implemented by a particular driving method of the 1.06 μm semiconductor laser and the synchronous modulation of the driving current of the 1.32 μm-band DFB laser.

The embodiments in accordance with the present invention will now be described in detail with reference to the accompanying drawings. In this case, however, the combinations of the wavelengths or the types of the conversion wavelengths and semiconductor lasers are not limited to these examples.

Embodiment 1

In the example 1, a wavelength conversion device module using LiNbO$_3$ as the nonlinear optical material is fabricated, and a light source apparatus with modulation function is fabricated which outputs wavelength converted light by using as the pumping source a 1.064 μm semiconductor laser with an FBG for stabilizing the wavelength and a 1.32 μm-band wavelength variable laser.

Figure 1:
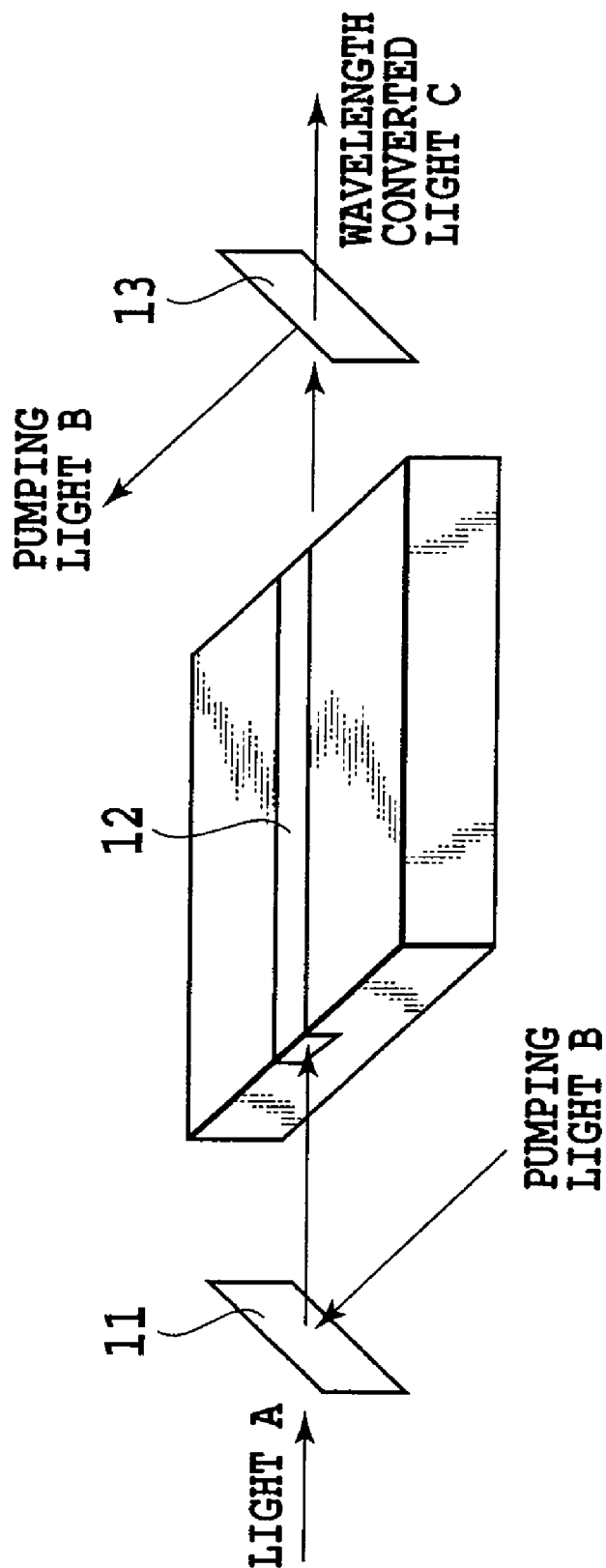
FIG. 1 is a diagram showing a principle of the wavelength conversion in accordance with the present invention.
Figure 2:
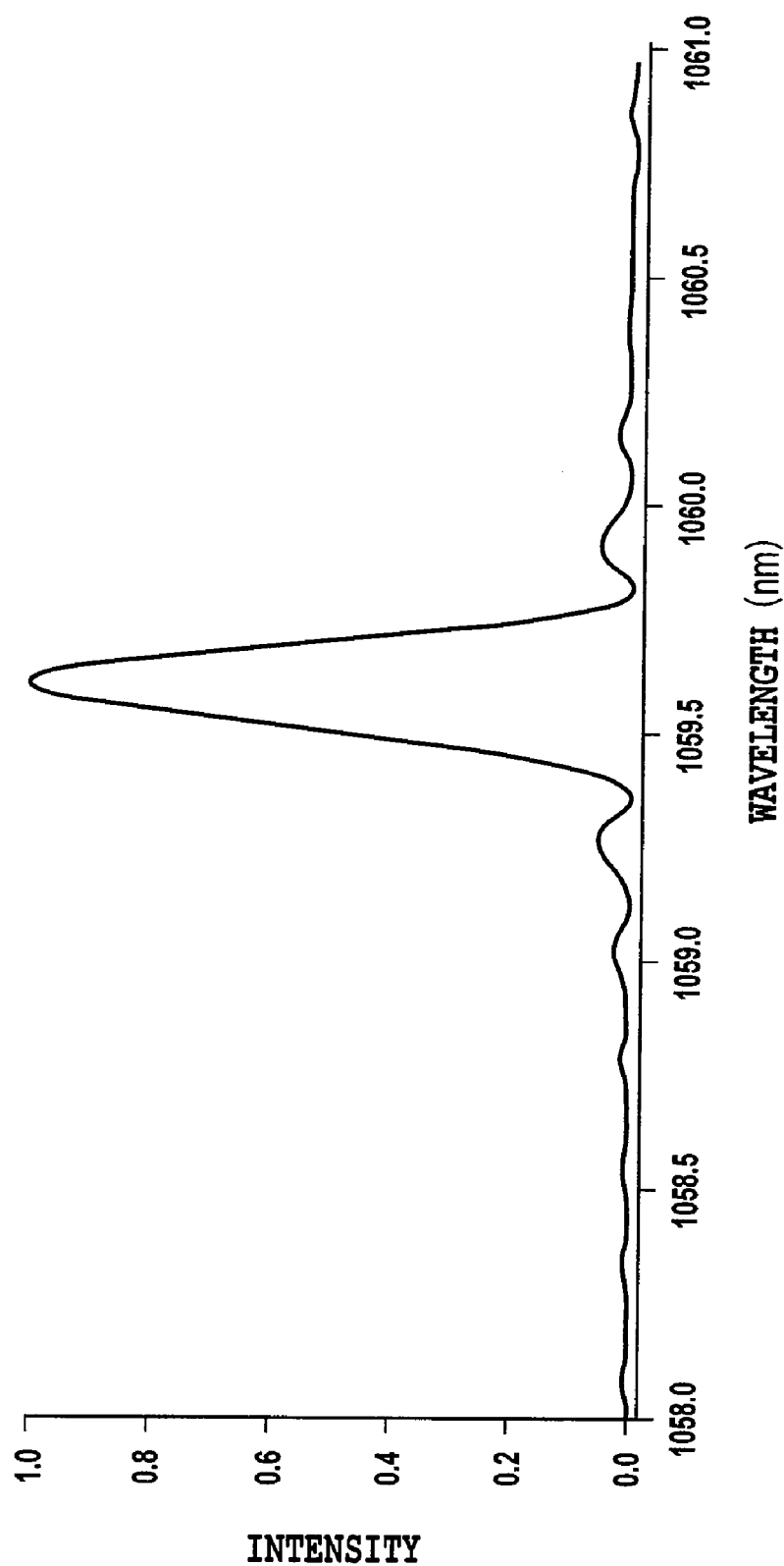
FIG. 2 is a diagram illustrating a pseudo-phase matching curve for obtaining green light with a wavelength of 0.53 μm by second-harmonic generation.
Figure 3:
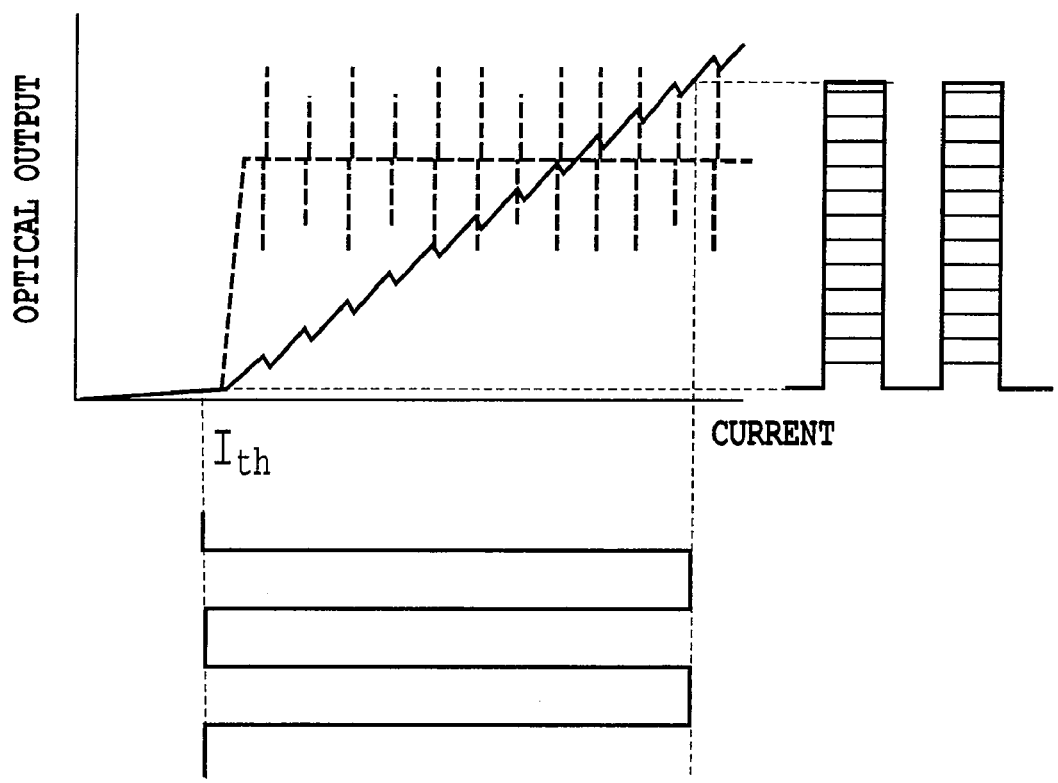
FIG. 3 is a diagram showing direct modulation of a conventional 1.064 μm-band laser.
Figure 4:
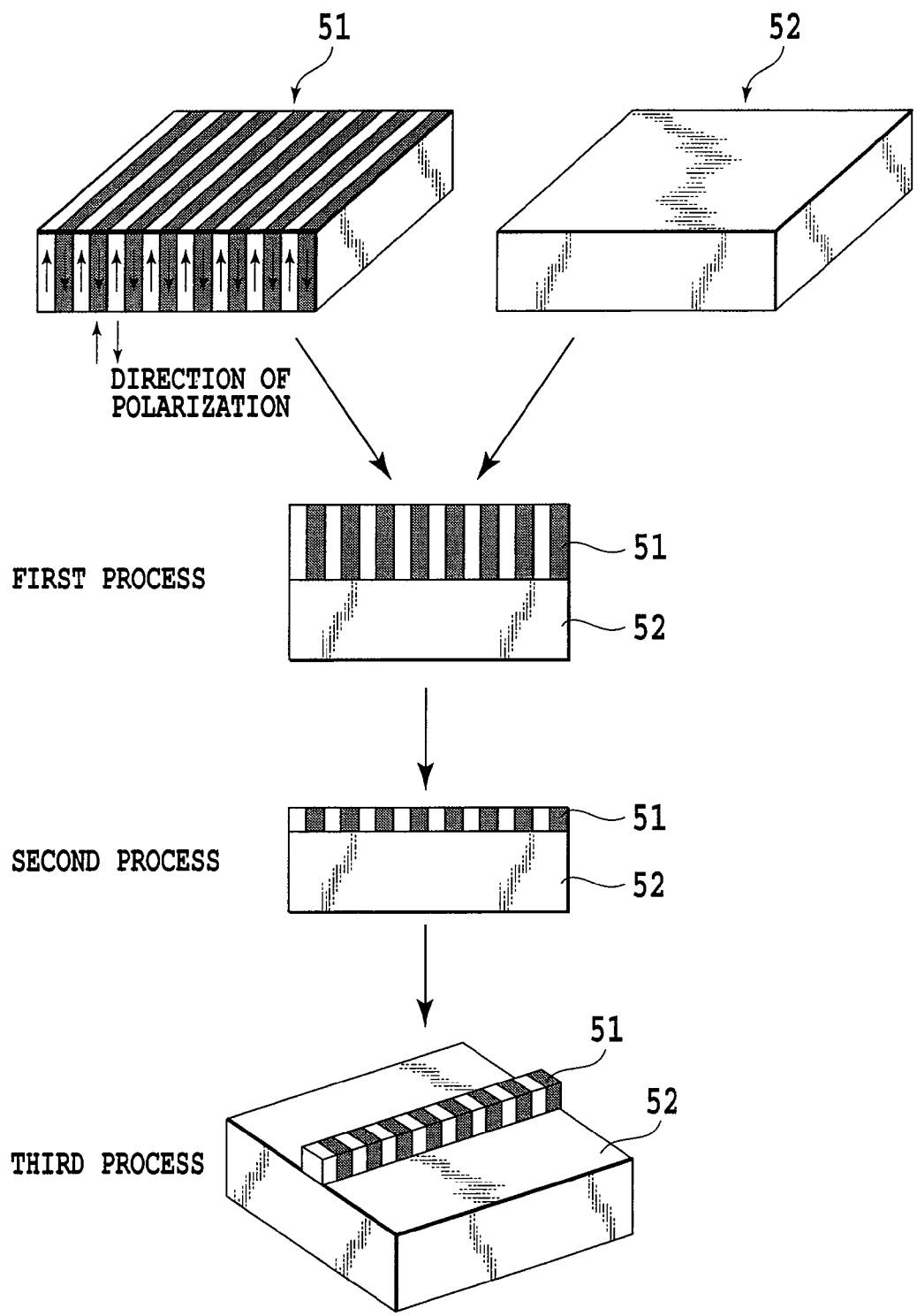
FIG. 4 is a diagram illustrating fabrication process of a wavelength conversion device.

FIG. 4 shows a fabrication process of the wavelength conversion device. In the example 1, the wavelength conversion device is fabricated by using a ridge waveguide structure using a direct junction substrate. More specifically, the wavelength conversion device is fabricated by joining a Z-cut, Zn-doped LiNbO$_3$ substrate 51 that has a periodic polarization inversion structure formed in advance and that serves as a first substrate, and a Z-cut, Mg-doped LiNbO$_3$ substrate 52 serving as a second substrate. Both the substrates are a 3 inch wafer whose both sides are optically polished, and are 300 μm thick. The ridge waveguide is an optical waveguide with a low optical loss, which has the optical confinement in two directions (two dimensions) perpendicular to the propagation direction of the light.

As for the first substrate 51 and second substrate 52 prepared, their surfaces are made hydrophilic by ordinary acid cleaning or alkali cleaning, and the two substrates are superimposed on each other in a clean environment. The superimposed first substrate 51 and second substrate 52 are placed in an electric furnace to undergo three hour heat treatment at 500° C. to carry out diffusion bonding. The bonded substrate is void free, and free from cracks even when it is placed in room temperature.

Next, by using an abrasive machine having an abrasive disk whose degree of flatness is controlled, an abrasive process is carried out until the thickness of the first substrate 51 of the bonded substrate becomes 6 μm. After the abrasive process, a polishing process is carried out to obtain a polished mirror surface.

Then the ridge waveguide with a waveguide width of 10 μm is fabricated by setting the polished thin-film substrate on a dicing saw, and by performing a high-precision processing with a diamond blade with a particle diameter of 4 μm or less.

The ridge waveguides that are fabricated in a single mode are cut out of the substrate in thin rectangles, and the wavelength conversion device of 60 mm long is fabricated by optically polishing the waveguide edge faces.

Besides the case of using the LiTaO$_3$ substrate as the second substrate 52, a similar wavelength conversion device can be fabricated by using a non-doped LiNbO$_3$ substrate as the first substrate and a LiTaO$_3$ substrate as the second substrate. As for the thickness of the substrate, besides the 500 μm thick substrate, a substrate can be employed with a thickness of equal to or greater than 200 μm and equal to or less than 1 mm.

Figure 5:
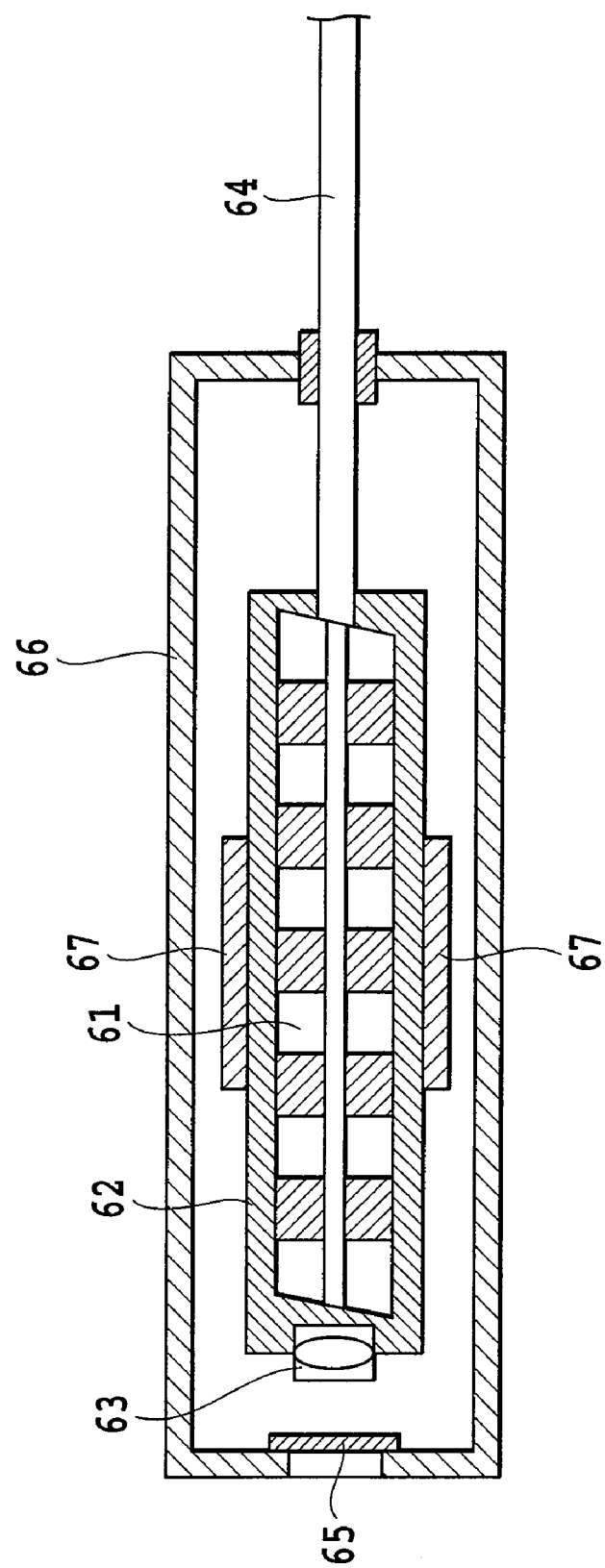
FIG. 5 is a view showing a wavelength conversion device module.

FIG. 5 shows a wavelength conversion module. The wavelength conversion module is a device that emits the wavelength converted light of the difference frequency light or sum frequency light due to the nonlinear optical effect when the multiplexed pumping light is launched thereinto. A polarization maintaining single mode optical fiber 64 is fusion spliced to the wavelength conversion device 61 fabricated. The wavelength conversion device 61 is bonded to a carrier 62 mounted in a package 66 that includes a Peltier device 67 for temperature adjustment. By optically coupling with an input fiber via a filter 65 using a lens 63, the wavelength conversion module is fabricated.

Figure 6:
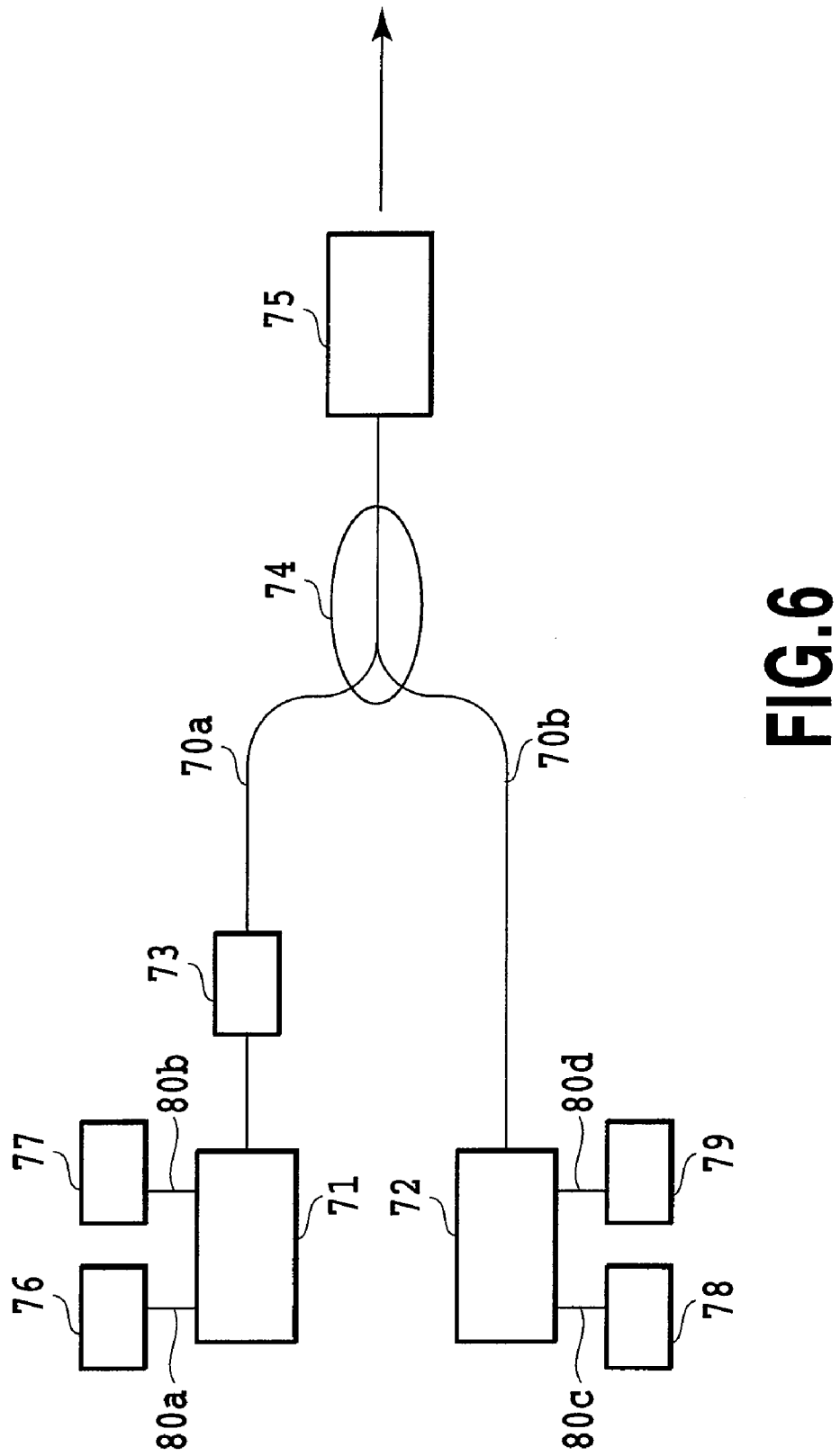
FIG. 6 is a block diagram showing a configuration of a light source apparatus with modulation function in accordance with the present invention.

FIG. 6 shows the light source apparatus with modulation function employing the wavelength conversion module fabricated. First, the input side fiber of the wavelength conversion device module 75 is fusion spliced to the output fiber of a 1.06/1.32 μm WDM coupler 74. Second, a 1.06 μm input fiber 70a of the WDM coupler 74 is fusion spliced to an FBG 73, and the FBG 73 is fusion spliced to a 1.064 μm-band semiconductor laser 71. Here, the FBG 73 is placed outside the 1.064 μm-band semiconductor laser 71. Third, a 1.32 μm input fiber 70b of the WDM coupler 74 is fusion spliced to an output fiber of a 1.32 μm DFB laser 72. The 1.064 μm-band semiconductor laser 71 is connected to a temperature control unit 76 and to a pulse driving power supply 77 via connecting lines 80a and 80b. The 1.32 μm-band DFB laser 72 is connected to a temperature control unit 78 and to a DC driving power supply 79 via connecting lines 80c and 80d. Thus, the light source apparatus with modulation function is completed. The 1.064 μm-band semiconductor laser 71 and the 1.32 μm-band DFB laser 72 are maintained at constant temperature by the temperature control units 76 and 78. In addition, the 1.064 μm-band semiconductor laser 71 is controlled by the pulse driving power supply 77, and the 1.32 μm-band DFB laser 72 is controlled by the DC driving power supply 79. Here, the FBG 73 has a reflectance of 20% and a reflection band of 0.1 nm which is narrower than the resonance wavelength spacing of 0.12 nm determined by the device length 1.2 mm of the 1.064 μm-band semiconductor laser 71.

Figure 7A:
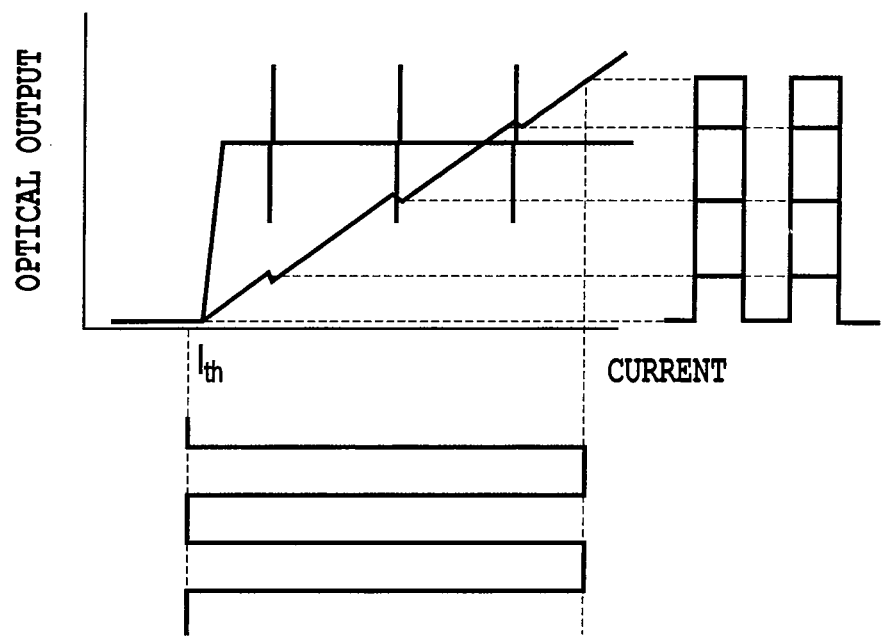
FIG. 7A is a diagram illustrating direct modulation of a 1.064 μm-band laser of an example 1.
Figure 7B:
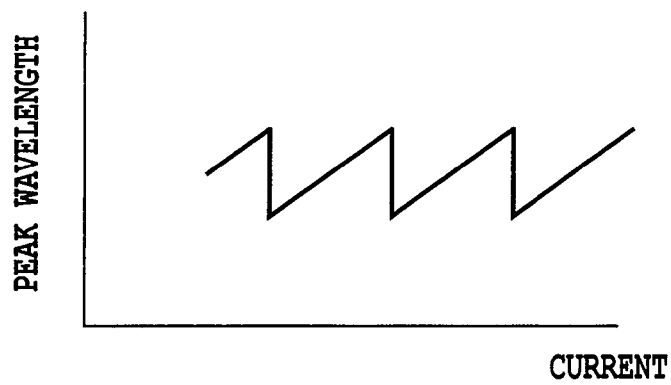
FIG. 7B is a diagram illustrating the dependence of the central wavelength of the 1.064 μm-band laser on the laser driving current in the example 1.

Although the 1.064 μm semiconductor laser 71, which has the FBG 73 stabilize its wavelength, operates at the single wavelength in principle, it has a wavelength shift toward a longer wavelength side due to heating with an increase of the current. If the wavelength of the output light emitted from the 1.064 μm semiconductor laser 71 exceeds the reflection band of the FBG, this will bring about a mode jump to another mode which occurs in the reflection band. At the current at which the mode jump occurs, a kink takes place at which the light output becomes discontinuous (FIG. 7A). However, the output light emitted from the 1.064 μm semiconductor laser 71, which has the FBG 73 stabilize the wavelength, has smooth differential efficiency characteristics except for the positions at which the light output kink occurs. Accordingly, although noise is produced at the kink positions, the output light of 6 mW is obtained. Thus, the ON/OFF modulation of the 0.59 μm wavelength converted light was carried out at 10 Mb/s under conditions allowing the noise of 10% or less in terms of a peak-to-peak value.

As for the location of the FBG, the inventors conducted tests within a range of 1-2 m from the 1.064 µm-band semiconductor laser, but similar characteristic results were obtained in any cases.

Although the example 1 employs the FBG with the reflection band of 0.1 nm, it can also employ an FBG with the reflection band of 20 pm or 10 pm or less.

Embodiment 2

The example 2 employs the light source apparatus with modulation function with the same configuration as that of the example 1. Here, the driving conditions of the pulse driving power supply 77 are limited.

Figure 8A:
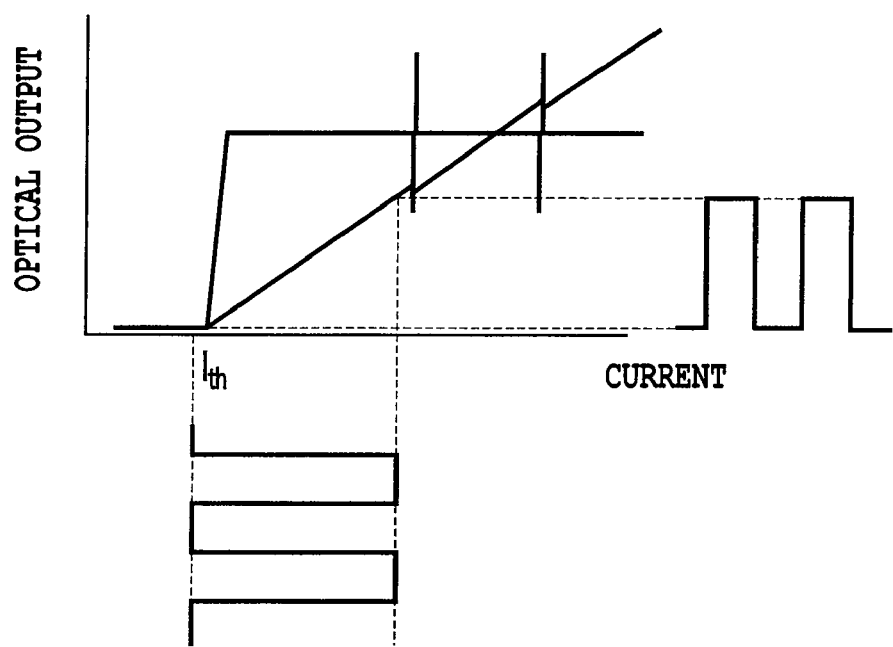
FIG. 8A is a diagram illustrating direct modulation of the 1.064 μm-band laser of an example 2.
Figure 8B:
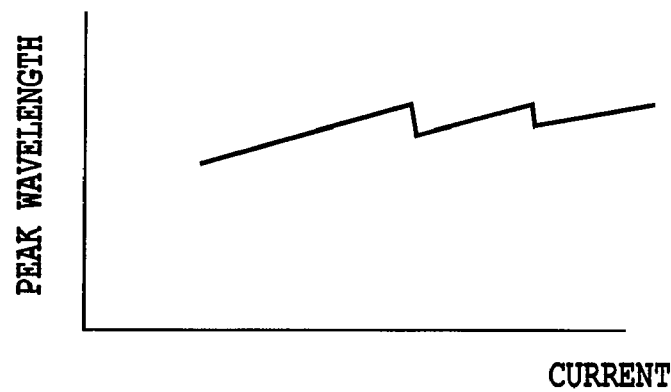
FIG. 8B is a diagram illustrating the dependence of the central wavelength of the 1.064 μm-band laser on the laser driving current in the example 2.

FIG. 8B illustrates the current-light output characteristics at that time. In the example 2, as in the example 1, the output light emitted from the 1.064 µm semiconductor laser 71, which has the FBG 73 stabilize the wavelength, has the smooth differential efficiency characteristics except for the positions at which the light output kinks take place.

First, the temperature control of the 1.064 µm-band semiconductor laser 71 is carried out so that the initial kink current value in the current-light output characteristics is set at nearly maximum. In this case, the lower limit of the current modulation range is set at a value equal to or less than the threshold value, and the upper limit is set at a current value slightly lower than the current value that will provide the initial kink in the current-light output characteristics. This will reduce the light output of the light source apparatus with modulation function. However, instead of that, the kink free laser characteristics without the mode jump can be implemented at the single wavelength. Thus, the ON/OFF modulation of the 0.59 µm wavelength converted light was carried out at 10 Mb/s under conditions allowing low noise of 2% or less in terms of a peak-to-peak value.

Embodiment 3

Figure 9:
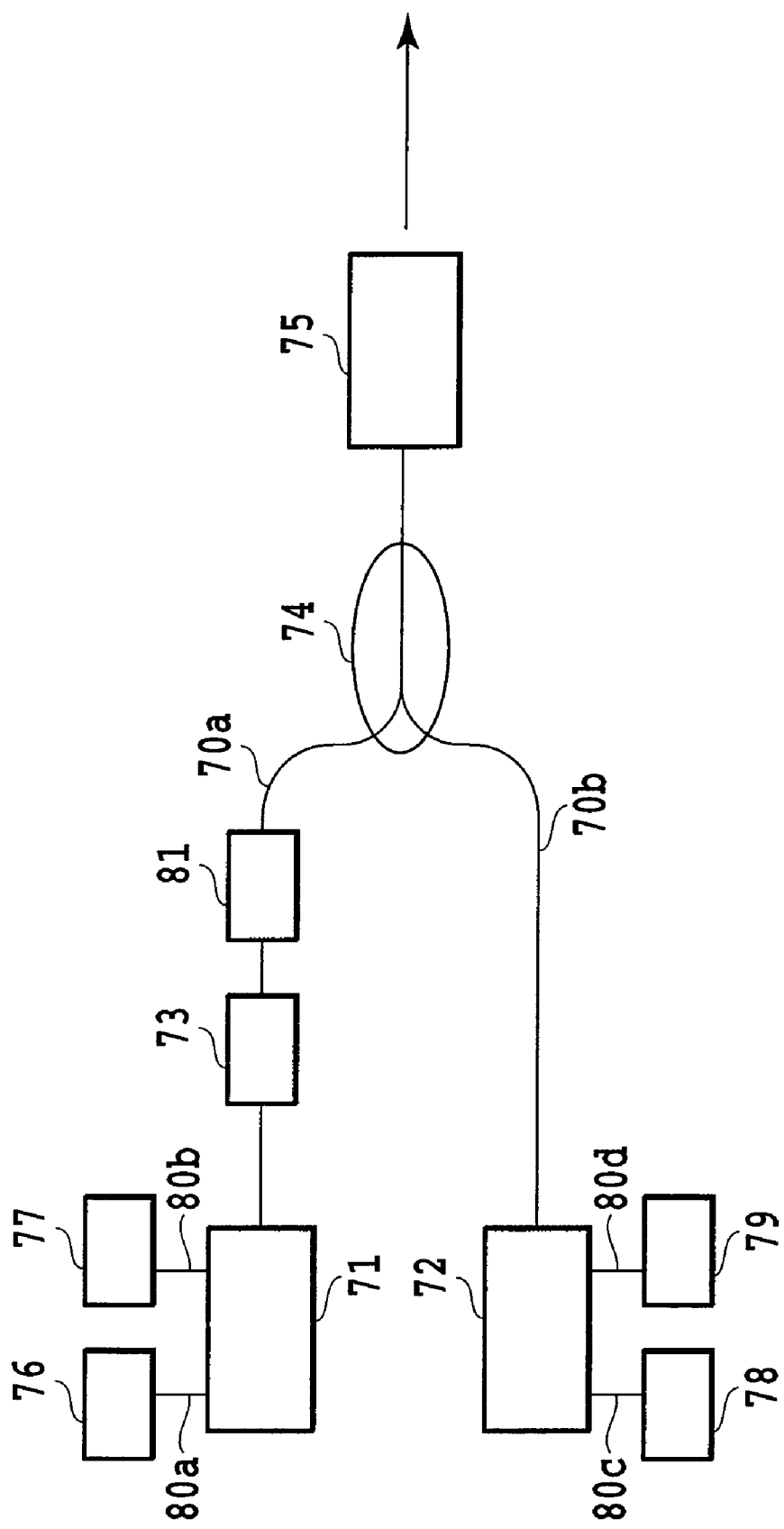
FIG. 9 is a block diagram showing a configuration of the light source apparatus with modulation function of an example 3.

FIG. 9 shows a light source apparatus with modulation function having an isolator 81 just behind the FBG 73. The input side fiber of the wavelength conversion device module 75 is fusion spliced to the output fiber of the 1.06/1.32 µm WDM coupler 74. Second, the 1.06 µm input fiber 70a of the WDM coupler 74 is fusion spliced to the isolator 81. In addition, the isolator 81 is fusion spliced to the FBG 73, and the FBG 73 is fusion spliced to the 1.064 µm-band semiconductor laser 71. Here, the FBG 73 is placed outside the 1.064 µm-band semiconductor laser 71. Furthermore, the 1.32 µm input fiber 70b of the WDM coupler 74 is fusion spliced to the output fiber of the 1.32 µm DFB laser 72. The 1.064 µm-band semiconductor laser 71 is connected to the temperature control unit 76 and to the pulse driving power supply 77 via the connecting lines 80a and 80b. The 1.32 µm-band DFB laser 72 is connected to the temperature control unit 78 and to the DC driving power supply 79 via the connecting lines 80c and 80d. Thus, the light source apparatus with modulation function is completed. In the configurations of the examples 1 and 2, the operation of the 1.064 µm-band semiconductor laser becomes unstable because of changes in the effect of reflected return light due to changes in the state of the apparatus based on changes in ambient temperature and the like. Thus, using the isolator 81 just behind the FBG 73 enables the 1.064 µm-band semiconductor laser to operate stably in terms of time.

Embodiment 4

Figure 10:
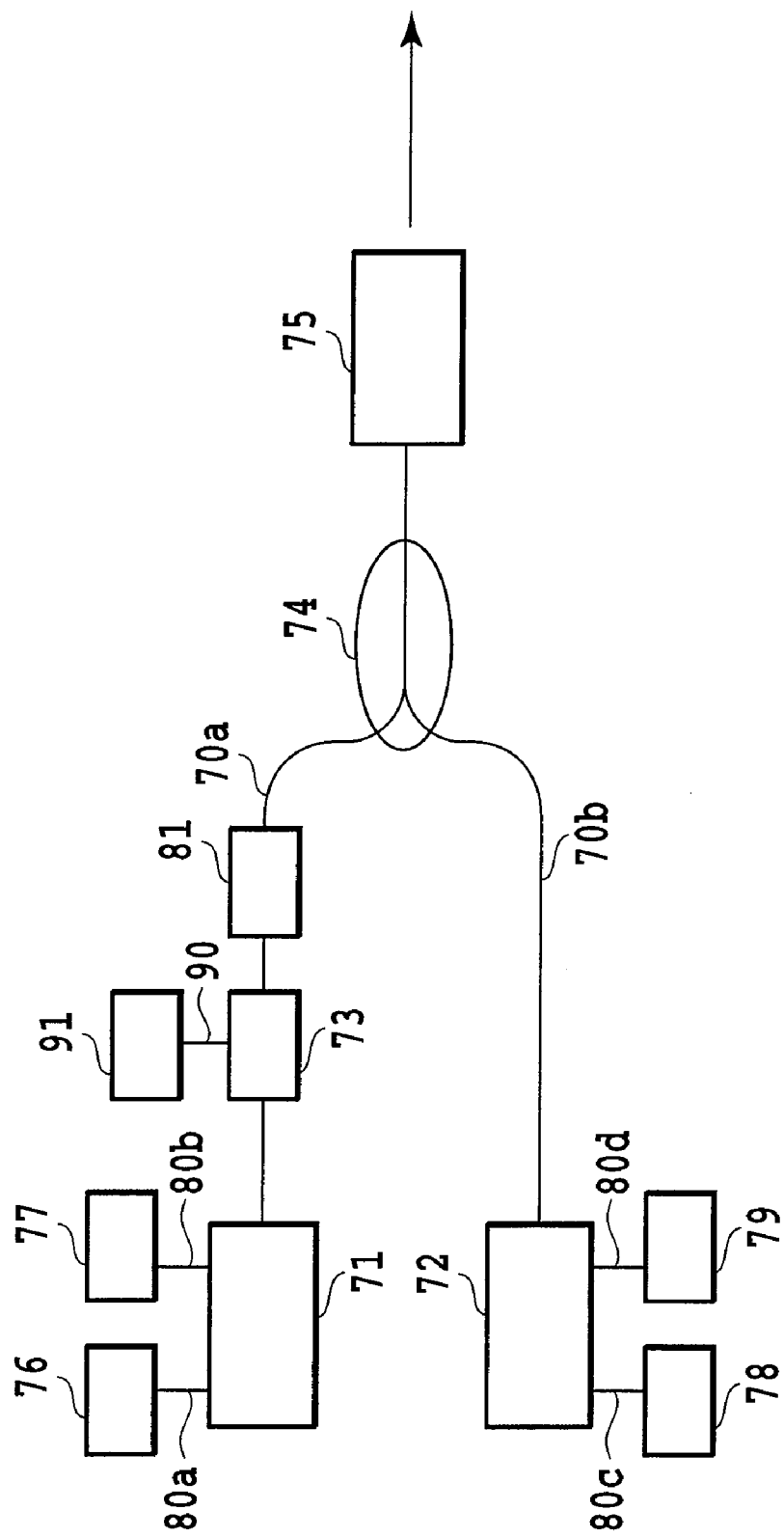
FIG. 10 is a block diagram showing a configuration of the light source apparatus with modulation function of an example 4.

FIG. 10 shows a light source apparatus with modulation function, which provides the FBG 73 with a temperature control function 91. The input side fiber of the wavelength conversion device module 75 is fusion spliced to the output fiber of the 1.06/1.32 µm WDM coupler 74. Then, the 1.06 µm input fiber 70a of the WDM coupler 74 is fusion spliced to the isolator 81. In addition, the isolator 81 is fusion spliced to the FBG 73, and the FBG 73 is fusion spliced to the 1.064 µm-band semiconductor laser 71. Besides, a connecting line 90 is fusion spliced to the FBG 73 to connect the FBG 73 to the temperature control unit 91. Here, the FBG 73 is placed outside the 1.064 µm-band semiconductor laser 71. Furthermore, the 1.32 µm input fiber 70b of the WDM coupler 74 is fusion spliced to the output fiber of the 1.32 µm DFB laser 72. The 1.064 µm-band semiconductor laser 71 is connected to the temperature control unit 76 and to the pulse driving power supply 77 via the connecting lines 80a and 80b. The 1.32 µm-band DFB laser 72 is connected to the temperature control unit 78 and to the DC driving power supply 79 via the connecting lines 80c and 80d. Thus, the light source apparatus with modulation function is completed. In the configurations of the examples 1, 2 and 3, the ambient temperature is assumed to be stable and the temperature control of the FBG 73 is not performed. However, the apparatus may be used in such a place as its ambient temperature varies greatly during the day. In such a case, the oscillation wavelength of the pumping light can vary, and the variation in the wavelength of the conversion light will cause a problem. Thus, the temperature control function 91 is added to the FBG 73. This will enable the light source apparatus with modulation function to operate with keeping its characteristics unchanged in spite of the changes in the ambient temperature from 10° C. to 45° C. It goes without saying that although the example 4 is described by way of example that employs the isolator 81, a configuration without the isolator 81 can also be used.

Incidentally, as for the 1.32 µm-band DFB laser modules, those incorporating the isolator are common.

Embodiment 5

The example 5, which employs the light source apparatus with modulation function with the same configuration as that of the example 1, exhibits the modulation operation in the case where the reflectance of the FBG side edge face of the 1.064 µm-band semiconductor laser 71 of FIG. 6 is made 1% or less. If the reflection of the FBG side front facet of the 1.064 µm-band semiconductor laser 71 remains at 1% or more, there coexist three reflections caused by both the front and rear facets of the 1.064 µm-band semiconductor laser 71 and the front facet of the FBG 73, forming a multiple resonator. Such a multiple resonator will make the laser wavelength and laser intensity unstable, resulting in the kinks occurring in the current-light output characteristics. To avoid such unstable operation, the reflectance of the FBG side front facet of the 1.064 µm-band semiconductor laser 71 is made 1% or less. Thus, the laser is implemented which has the resonator composed of the FBG 73 and the rear facet of the 1.064 µm-band semiconductor laser 71 on the side not connected to the FBG 73. In this case, the reflectance of the FBG 73 is 15%, and the full width at half maximum of the reflection spectrum is 20 pm. The FBG 73 is placed at about 1 m from the 1.064

μm-band semiconductor laser 71. In the laser composed of the 1.064 μm-band semiconductor laser 71 and the FBG 73, the longitudinal mode spacing is about 100 MHz, which is sufficiently narrower than the full width at half maximum of the FBG 73. Accordingly, the longitudinal mode oscillates in a multimode, and enables stable oscillation in spite of the return light from the outside. Here, it is preferable that the reflectance of the FBG 73 be 5% or more. However, if it is too high, it will bring about output reduction, or sharp output changes at the kink positions as illustrated in FIG. 7A.

Figure 14:
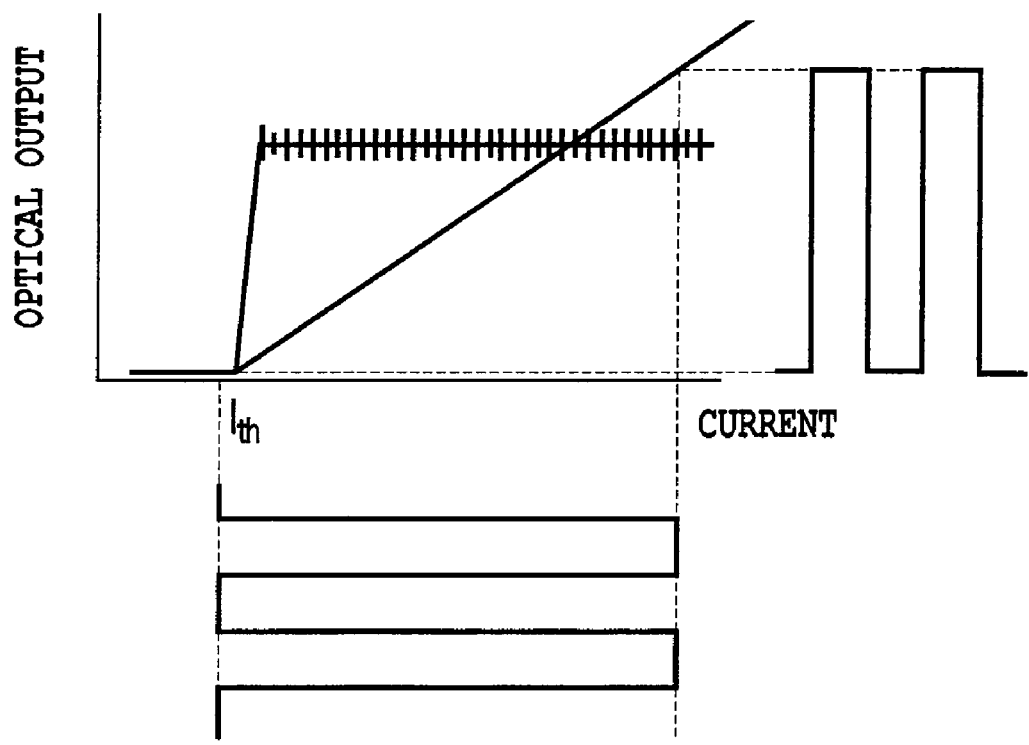
FIG. 14 is a diagram illustrating I-L characteristics of a 1.064 μm-band laser of an example 5.
Figure 15:
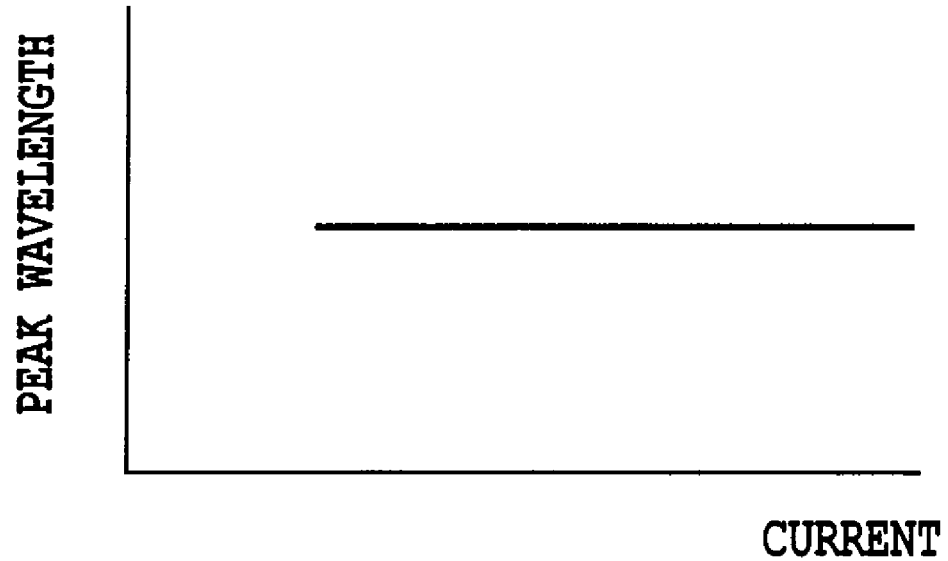
FIG. 15 is a diagram illustrating the dependence of the central wavelength of the 1.064 μm-band laser on the laser driving current in the example 5.

FIG. 14 illustrates the current-light output characteristics of the laser light with the wavelength of 1064 nm, which is output from the FBG 73, when the reflectance of the FBG side edge face of the 1.064 μm-band semiconductor laser 71 is made 1% or less. In addition, FIG. 15 illustrates the dependence of the central wavelength of the laser light on the laser driving current. As described above, when the reflectance of the 1.064 μm-band semiconductor laser 71 is reduced to 1% or less, the laser light output from the FBG 73 has stable multimode oscillation at 100 MHz spacing without any large kinks that fluctuate by 1% or more of the light output. In addition, although the half value width exhibits an increase with the current, the central wavelength varies by only 10 μm, which equals the measurement resolution or less.

By combining the 1.064 μm-band semiconductor laser 71, the reflectance of the FBG side edge face of which is made 1% or less, with the 1320 nm DFB laser 72, and by multiplexing the laser light emitted from the light source, the sum-frequency generation takes place and the 0.59 μm wavelength converted light is obtained. In addition, by modulating the 1.064 μm-band semiconductor laser 71 by using the pulse driving power supply 77, the 0.59 μm wavelength converted light can be modulated by the ON/OFF modulation at 10 Mb/s with a 10-step gradation.

Incidentally, in the example 5, the isolator behind the FBG 73 is not essential. In addition, not only the 1064 nm laser, but also other wavelength lasers with 980 nm or 940 nm can achieve similar characteristics.

Embodiment 6

Figure 16:
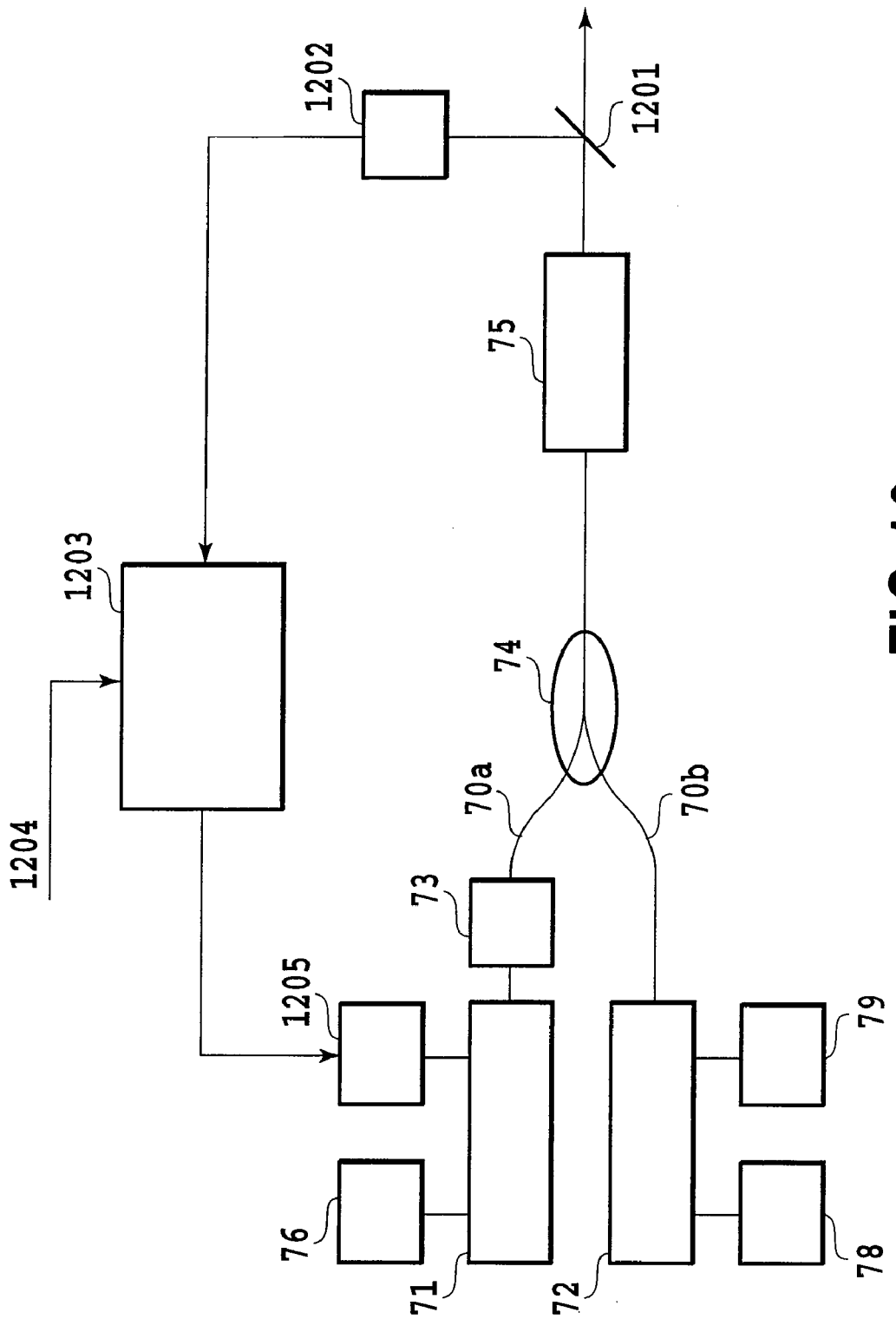
FIG. 16 is a block diagram showing a configuration of a light source apparatus with modulation function in accordance with the present invention, in which the driving current of a laser with FBG is provided with feedback to keep the output light intensity constant.

FIG. 16 shows a configuration of a light source apparatus with modulation function that provides feedback to the driving current of the laser with the FBG in such a manner as to regulate the output light intensity of the present invention. The example 6 has, in addition to the configuration of the example 1, a beam sampler 1201, a photodetector 1202, a comparator 1203, and a pulse driving power supply 1205. The beam sampler 1201 is mounted on the optical path of the laser light output from the wavelength conversion device module 75, and is optically connected to the wavelength conversion device module 75 and to the photodetector 1202. The photodetector 1202 converts the detected light intensity to electric signal, and is electrically connected to the comparator 1203 so that it can deliver the electric signal to the comparator 1203. The comparator 1203 is also connected to the pulse driving power supply 1205, and the pulse driving power supply 1205 is further connected to the 1.064 μm-band semiconductor laser 71.

To keep the output light intensity constant with this configuration, the beam sampler 1201 diverges part of the output intensity, and the photodetector 1202 detects it and provides feedback to the driving current of the laser with the FBG to regulate the intensity. The reflectance of the beam sampler 1201 is from 1% to about 10%. The comparator 1203 compares the electric signal about the light intensity fed from the photodetector 1202 with the electric input signal 1204 fed from the outside, and controls the pulse driving power supply 1205 in such a manner that the two signals maintain the relationships determined in advance.

Figure 17:
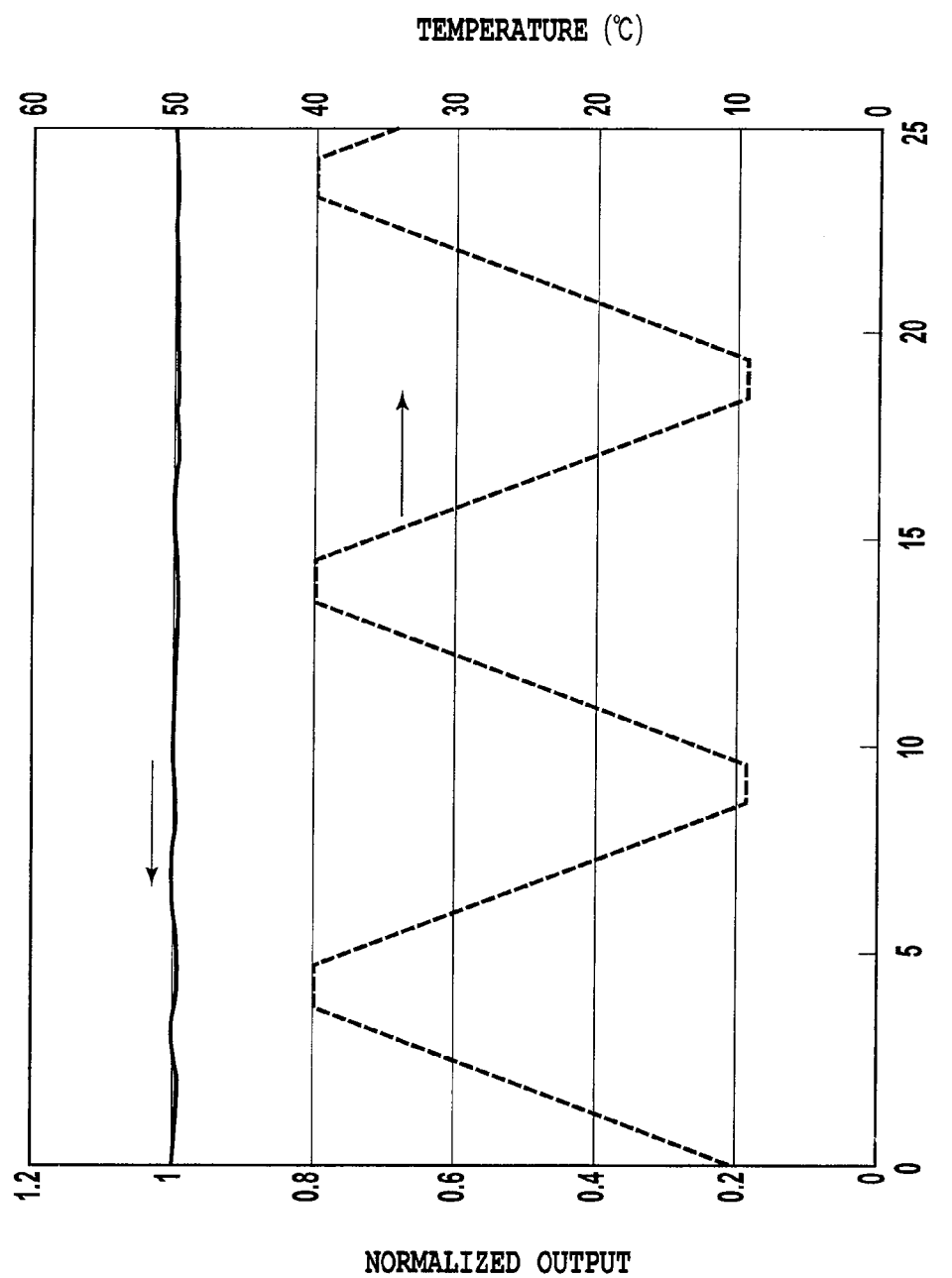
FIG. 17 is a diagram illustrating time variations in the laser output intensity when operating a laser in a constant temperature bath varying from 10° C. to 40° C.

FIG. 17 illustrates time variations of the laser output intensity when operating the laser of the example 6 in the constant temperature bath varying from 10° C. to 40° C. FIG. 17 shows the values normalized by the initial laser output. The configuration of the example 6 can achieve good results that the intensity variations of the output light remain within ±1% even if the ambient temperature of the apparatus varies from 10° C. to 40° C.

Embodiment 7

The example 7 employs in the configuration of the example 1, 2, 3, 4, 5 or 6, a driving power supply with modulation function as the driving power supply of the 1.32 μm-band DFB laser. In other words, by controlling the current of the 1.32 μm-band DFB laser, the example 7 provides a conversion function to the light source apparatus with modulation function.

Figure 11A:
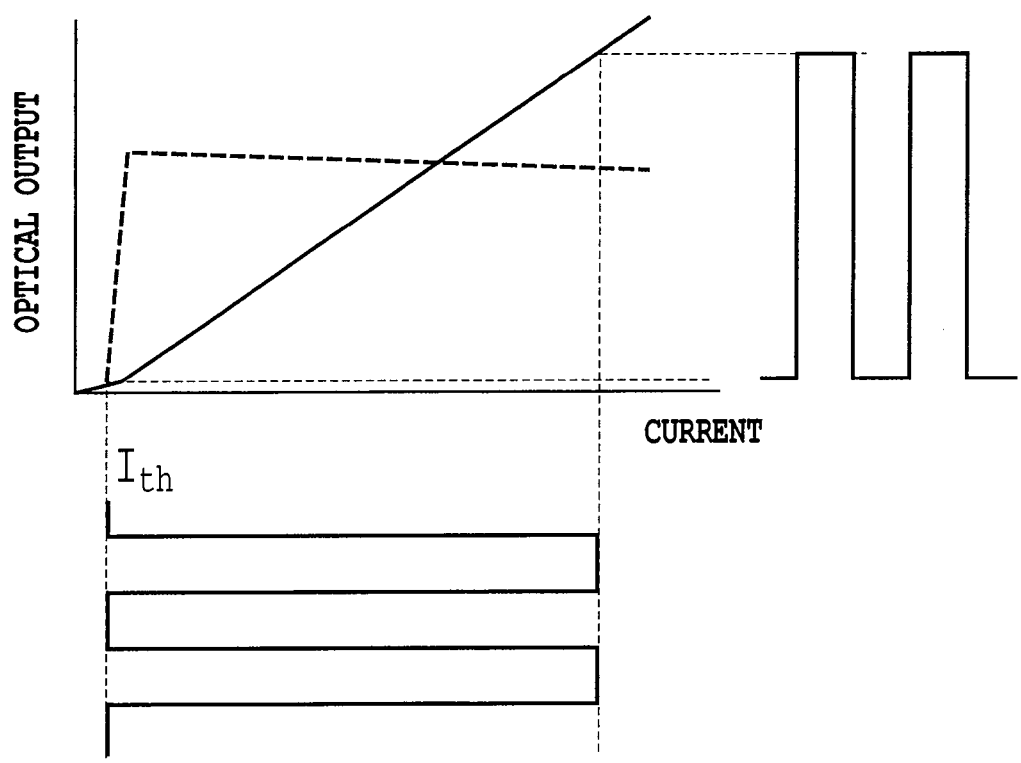
FIG. 11A is a diagram illustrating direct modulation of a 1.32 μm-band DFB laser.

To achieve this, the example 7 carries out the modulation by employing a high output type 1.064 μm-band semiconductor laser to increase the operation current and to nearly double its output to about 80 mW, and by turning on and off the current of the 1.32 μm-band DFB laser in the range from the threshold value or less to 80 mA. As a result, as illustrated in FIG. 11A, with limiting the reduction in the intensity of the 0.58 μm wavelength converted light to about ½, the ON/OFF modulation of the 0.58 μm wavelength converted light can be carried out at 10 Mb/s under conditions allowing noise of 2% or less in terms of a peak-to-peak value.

When providing the ON/OFF modulation at the threshold value or less to both the 1.064 μm-band semiconductor laser, which has the FBG stabilize the wavelength, and the 1.32 μm-band DFB laser, the ON/OFF ratio of the modulation light can be improved from 70 dB to 100 dB by modulating in synchronization.

Although the foregoing descriptions are made by way of example of using $LiNbO_3$ as the nonlinear optical material, similar effect can be achieved by using $LiTaO_3$ or $LiNb(x) Ta(1-x)O_3$ ($0 \leq x \leq 1$). Furthermore, similar effect can be obtained by combining these three kinds, or by using as the nonlinear optical material a material containing at least one material selected from the group consisting of Mg and Zn as a dopant.

Figure 12:
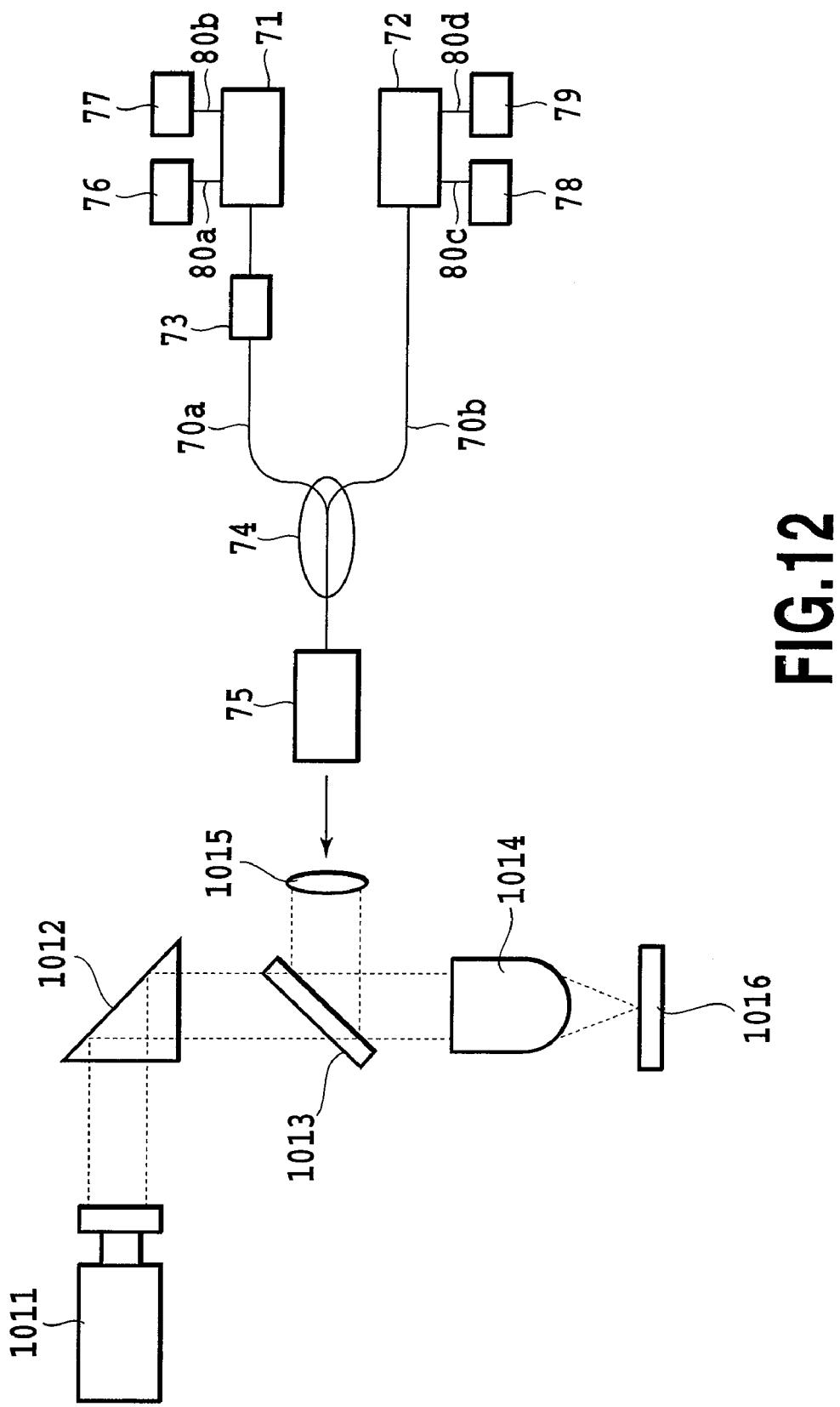
FIG. 12 is a block diagram showing a configuration that incorporates the light source apparatus with modulation function in accordance with the present invention into a fluorescence microscope system.

FIG. 12 shows a configuration that incorporates a light source apparatus with conversion function into a fluorescence microscope system. The light source apparatus with conversion function incorporated is the same as that of the example 1. In the fluorescence microscope system, a wavelength conversion device module 75 emits the wavelength converted light, a dichroic mirror 1013 reflects the laser light, and an object lens 1014 focuses the reflected light, thereby irradiating a cell 1016 with a spot-like laser light. The cell 1016 is colored with a fluorescent dye, and the fluorescent dye of the cell 1016 gives off fluorescence when excited by the wavelength converted light. The fluorescence the cell 1016 gives off passes through the object lens 1014, dichroic mirror 1013, and prism 1012, and is launched into a high sensitivity camera 1011. The high sensitivity camera 1011 converts the fluorescence launched thereinto to an electric signal. An image display section generates a fluorescent image from the individual electric signals fed from the high sensitivity camera 1011, and displays the image. By incorporating the light source apparatus with conversion function into the fluorescence microscope system and by using it for observing fluorescent protein (GFP) introduced into a cell by mixing into a gene of another protein, it becomes possible to put a fluorescent label to a particular structural body or functional molecule in a live cell at a high sensitivity.

In addition, when employing the 0.94 μm-band semiconductor laser whose wavelength is stabilized in the same configuration, its combination with the 1.32 μm-band DFB laser can achieve 543 nm wavelength converted light.

Figure 11B:
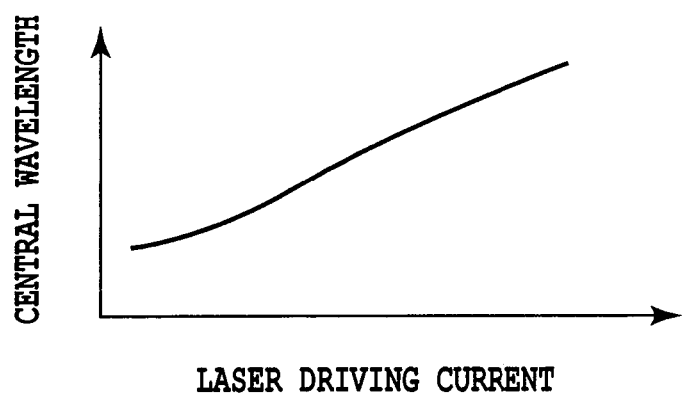
FIG. 11B is a diagram illustrating the dependence of the central wavelength of the 1.32 μm-band DFB laser on the laser driving current.

In addition, as for the pumping laser of the light source with the characteristics as illustrated in FIGS. 8A and 8B or in FIGS. 11A and 11B, its ON level can be set at any one of the 10 levels whose maximum value is the ON state as shown in these figures. In this case, the ON/OFF 10-step gradation modulation of the 0.58 μm wavelength converted light can be carried out at 10 Mb/s under conditions allowing the light intensity reduction of 5% or less in terms of a peak-to-peak value.

Although the foregoing examples are described by way of example of the sum frequency or difference-frequency generation, they are also applicable to the modulation light source with the second-harmonic generation using only the first semiconductor laser light source or the second semiconductor laser light source as the semiconductor laser light source.

Figure 13:
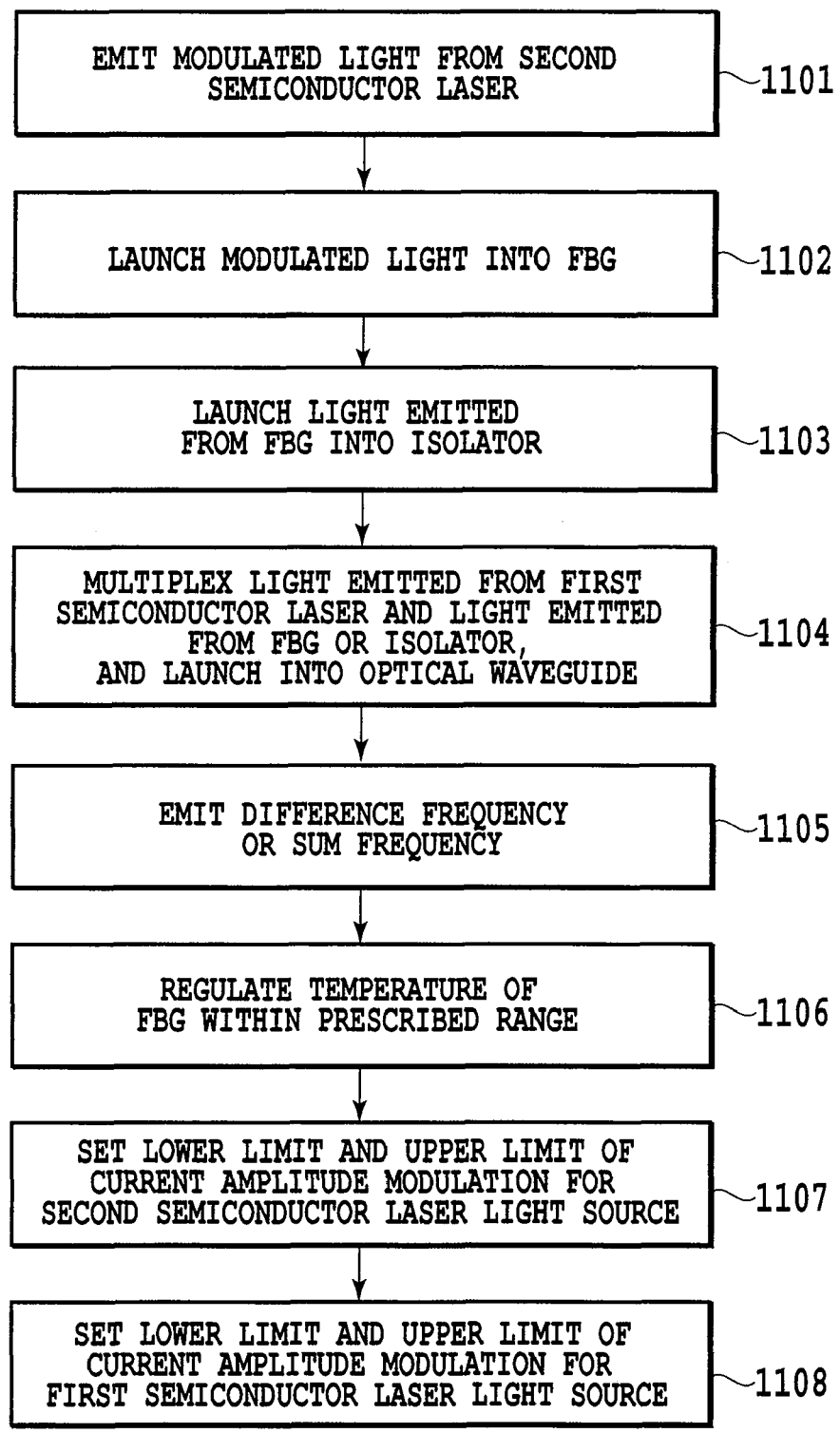
FIG. 13 is a flowchart illustrating a driving method of the light source apparatus with modulation function in accordance with the present invention.

FIG. 13 is a flowchart illustrating a light modulation method using the light source apparatus with modulation function. The light modulation method described here covers all the foregoing examples. Accordingly, as the light modulation method in each embodiment, it need not include all these steps.

At step 1101, the second semiconductor laser emits modulated light. At step 1102, the light modulated at step 1101 is launched into the FBG with the reflection band narrower than the resonance wavelength spacing determined by the device length of the second semiconductor laser. At step 1103, the light emitted from the FBG is launched into the isolator. At step 1104, the light emitted from the first semiconductor laser and the light emitted from the FBG or isolator are multiplexed, and is launched into the optical waveguide. At step 1105, the optical waveguide emits the difference frequency or sum frequency of the light fed from the first and second semiconductor lasers. At step 1106, the temperature of the FBG is regulated within the predetermined range. At step 1107, the lower limit of the current amplitude modulation for the second semiconductor laser light source is set in such a manner that the lower limit is equal to or less than the threshold value and that the emitted wavelength becomes a shorter wavelength side wavelength of the pseudo-phase matching band of the nonlinear optical material; and the upper limit of the current amplitude modulation is set at a current value lower than the current value causing the initial kink in the current-light output characteristics. At step 1108, the lower limit of the current amplitude modulation for the first semiconductor laser light source is set in such a manner that the lower limit is equal to or less than the threshold value and that the emitted wavelength becomes a shorter wavelength side wavelength of the pseudo-phase matching band of the nonlinear optical material; and the upper limit of the current amplitude modulation is set in such a manner that the emitted wavelength becomes a longer wavelength side wavelength of the pseudo-phase matching band of the nonlinear optical material.

Here, it is free whether the light modulation method in each embodiment includes each of the steps 1103 and 1106-1108. In addition, the insertion position of each of the steps 1106-1108 is free, and their sequence can be changed.

Figure 18:
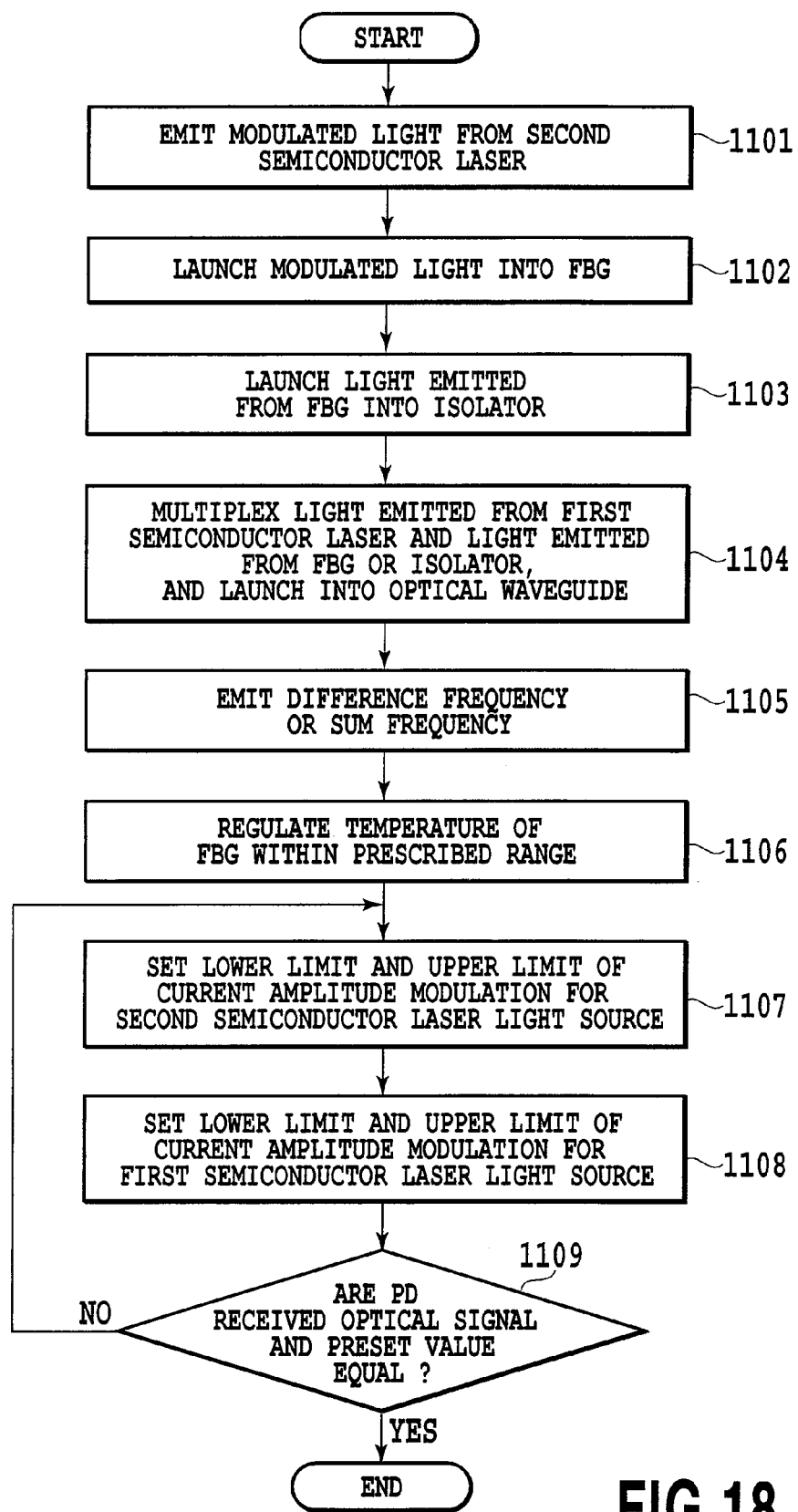
FIG. 18 is a flowchart illustrating a driving method of the light source apparatus with modulation function in accordance with the present invention.

FIG. 18 is a flowchart illustrating the light source modulation method using the light source apparatus with modulation function corresponding to the example 6. Following the final step of FIG. 13, a step is added which compares the received light signal of the photodetector with the set value, and provides feedback to step 1107.

The foregoing description is made by way of example of the light source apparatus with modulation function for generating the 0.58 μm conversion light. However, as for the light source apparatus with modulation function for generating 0.56 μm wavelength converted light by employing a 1.307 μm-band DFB laser as the first semiconductor laser light source and by employing a 0.976 μm-band semiconductor laser having an FBG for stabilizing the wavelength in the second semiconductor laser light source, a modulation function with equal practical light intensity can be obtained.

The invention claimed is:

1. A light source apparatus with modulation function having an optical waveguide composed of a nonlinear optical material with a structure having a nonlinear constant modulated periodically, said light source apparatus multiplexing pumping light from first and second semiconductor laser light sources having different wavelengths and launching multiplexed pumping light into said optical waveguide, thereby outputting a difference frequency or a sum frequency produced from said optical waveguide, or outputting a second harmonic from said second semiconductor laser light source, wherein said second semiconductor laser light source comprises:
    a semiconductor laser;
    an FBG; and
    means for modulating said semiconductor laser,
    wherein a reflection band of said FBG is narrower than a resonance wavelength spacing determined by a device length of said semiconductor laser.

2. The light source apparatus with modulation function as claimed in claim 1, wherein
    a lower limit of current amplitude modulation for said second semiconductor laser light source is set in a manner that the lower limit is equal to or less than a threshold value and that an emitted wavelength becomes a shorter wavelength side wavelength in a pseudo-phase matching band of the nonlinear optical material; and
    an upper limit of the current amplitude modulation is set at a current value lower than a current value causing an initial kink in current-light output characteristics.

3. The light source apparatus with modulation function as claimed in claim 1, further comprising an isolator connected to an output of said FBG.

4. The light source apparatus with modulation function as claimed in claim 1, further comprising temperature control means added to said FBG.

5. The light source apparatus with modulation function as claimed in claim 1, wherein
    said first and second semiconductor laser light sources comprise means for modulating output light emitted from semiconductor lasers, and are synchronized to each other.

6. The light source apparatus with modulation function as claimed in claim 1, wherein
    said nonlinear optical crystal (material) consists of one of $LiNbO_3$, $LiTaO_3$, and $LiNb(x)Ta(1-x)O_3 (0 \leq x \leq 1)$, or a combination of them, or includes as a dopant to them at least one material selected from a group consisting of Mg and Zn.

7. The light source apparatus with modulation function having the light source with modulation function as defined in claim 1 incorporated into a fluorescence microscope system.

8. A light source apparatus with modulation function having an optical waveguide composed of a nonlinear optical material with a structure having a nonlinear constant modulated periodically, said light source apparatus multiplexing pumping light from first and second semiconductor laser light sources having different wavelengths and launching multiplexed pumping light into said optical waveguide, thereby outputting a difference frequency or a sum frequency produced from said optical waveguide, or outputting a second harmonic from said first semiconductor laser light source, wherein said first semiconductor laser light source comprises:
   a diffraction grating; and
   means for modulating output light emitted from a semiconductor laser, and wherein
   a lower limit of current amplitude modulation for said first semiconductor laser light source is set in a manner that the lower limit is equal to or less than a threshold value and that an emitted wavelength becomes a shorter wavelength side wavelength in a pseudo-phase matching band of the nonlinear optical material; and
   an upper limit of the current amplitude modulation is a current value that achieves a shorter wavelength side wavelength than a peak wavelength of a pseudo-phase matching band of the nonlinear optical material, and a longer wavelength side wavelength than an emitted wavelength immediately after the threshold value.

9. The light source apparatus with modulation function as claimed in claim 8, wherein
   said first and second semiconductor laser light sources comprise means for modulating output light emitted from semiconductor lasers, and are synchronized to each other.

10. The light source apparatus with modulation function as claimed in claim 8, wherein
   said nonlinear optical crystal (material) consists of one of LiNbO$_3$, LiTaO$_3$, and LiNb(x)Ta(1-x)O$_3$(0≦x≦1), or a combination of them, or includes as a dopant to them at least one material selected from a group consisting of Mg and Zn.

11. The light source apparatus with modulation function having the light source with modulation function as defined in claim 8 incorporated into a fluorescence microscope system.

12. A light modulation method employing a light source apparatus including a first semiconductor laser, a second semiconductor laser, and an optical waveguide composed of a nonlinear optical material with a structure having a nonlinear constant modulated periodically, said light modulation method comprising:
   a step of emitting modulated light from said second semiconductor laser;
   a step of launching the modulated light at the step of emitting into an FBG with a reflection band narrower than a resonance wavelength spacing determined by a device length of said second semiconductor laser;
   a step of launching into said optical waveguide, light resultant from multiplexing light emitted from said first semiconductor laser and light emitted from said FBG; and
   a step of emitting from said optical waveguide a difference frequency or a sum frequency of light from said first and second semiconductor lasers.

13. The light modulation method as claimed in claim 12, further comprising a step of launching the light emitted from said FBG into an isolator, wherein the step of launching into said optical waveguide comprises a step of multiplexing the light emitted from said first semiconductor laser and light emitted from said isolator.

14. The light modulation method as claimed in claim 12, further comprising a step of regulating temperature of said FBG within a prescribed range.

15. The light modulation method as claimed in claim 12, further comprising: a step of setting a lower limit of current amplitude modulation for said second semiconductor laser light source in a manner that the lower limit is equal to or less than a threshold value and that an emitted wavelength becomes a shorter wavelength side wavelength in a pseudo-phase matching band of the nonlinear optical material; and a step of setting an upper limit of the current amplitude modulation at a current value lower than a current value causing an initial kink in current-light output characteristics.

16. The light modulation method as claimed in claim 12, further comprising a step of modulating the light of said first semiconductor laser in synchronization with modulation of the light of said second semiconductor laser.

17. A light modulation method for outputting a sum frequency, said light modulation method having a first semiconductor laser with a built-in diffraction grating, a second semiconductor laser, and an optical waveguide composed of a nonlinear optical material with a structure having a nonlinear constant modulated periodically, said light modulation method comprising:
   a step of emitting modulated light from said first semiconductor laser;
   a step of launching into said optical waveguide, light resultant from multiplexing light emitted from said first semiconductor laser and light emitted from said second semiconductor laser;
   a step of emitting from said optical waveguide a difference frequency or a sum frequency of light from said first and second semiconductor lasers;
   a step of setting a lower limit of current amplitude modulation for said first semiconductor laser light source in a manner that the lower limit is equal to or less than a threshold value and that an emitted wavelength becomes a shorter wavelength side wavelength in a pseudo-phase matching band of the nonlinear optical material; and
   a step of setting an upper limit of the current amplitude modulation in a manner that the emitted wavelength becomes a shorter wavelength side wavelength than a peak wavelength of the pseudo-phase matching band of the nonlinear optical material, and becomes a longer wavelength side wavelength than an emitted wavelength immediately after the threshold value.

18. The light modulation method as claimed in claim 17, further comprising a step of modulating the light of said first semiconductor laser in synchronization with modulation of the light of said second semiconductor laser.

* * * * *